(12) United States Patent
Lee

(10) Patent No.: US 11,205,487 B2
(45) Date of Patent: Dec. 21, 2021

(54) MEMORY DEVICE AND METHOD OF OPERATING THE SAME

(71) Applicant: SK hynix Inc., Icheon-si (KR)

(72) Inventor: Hee Joo Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/917,586

(22) Filed: Jun. 30, 2020

(65) Prior Publication Data

US 2021/0210146 A1 Jul. 8, 2021

(30) Foreign Application Priority Data

Jan. 8, 2020 (KR) ........................ 10-2020-0002482

(51) Int. Cl.
| | | |
|---|---|---|
| *G11C 16/08* | (2006.01) | |
| *G11C 16/26* | (2006.01) | |
| *G11C 16/34* | (2006.01) | |
| *G11C 16/30* | (2006.01) | |
| *G11C 16/20* | (2006.01) | |
| *G11C 16/04* | (2006.01) | |
| *G11C 16/32* | (2006.01) | |
| *G11C 11/56* | (2006.01) | |

(52) U.S. Cl.
CPC .......... *G11C 16/20* (2013.01); *G11C 16/0483* (2013.01); *G11C 16/08* (2013.01); *G11C 16/30* (2013.01); *G11C 16/32* (2013.01); *G11C 16/3459* (2013.01); *G11C 11/5621* (2013.01); *G11C 11/5671* (2013.01)

(58) Field of Classification Search
CPC ..... G11C 16/20; G11C 16/0483; G11C 16/08; G11C 16/30; G11C 16/32; G11C 16/3459; G11C 11/5621; G11C 11/5671
See application file for complete search history.

(56) References Cited

U.S. PATENT DOCUMENTS

| | | | |
|---|---|---|---|
| 9,685,235 B2 * | 6/2017 | Park | .................. G11C 7/02 |
| 9,754,673 B2 * | 9/2017 | Park | ............... H01L 27/11556 |
| 2010/0091575 A1 * | 4/2010 | Kim | ............... G11C 16/0483 365/185.25 |
| 2011/0019486 A1 * | 1/2011 | Jang | ............... G11C 16/0483 365/185.25 |
| 2016/0019969 A1 * | 1/2016 | Lim | ...................... G11C 16/08 365/185.12 |
| 2017/0133095 A1 * | 5/2017 | Park | ............... G11C 16/0483 |
| 2018/0374541 A1 * | 12/2018 | Jung | ...................... G11C 16/08 |

(Continued)

FOREIGN PATENT DOCUMENTS

| KR | 101036720 B1 | 5/2011 |
|---|---|---|
| KR | 1020170129516 A | 11/2017 |

*Primary Examiner* — Ly D Pham
(74) *Attorney, Agent, or Firm* — William Park & Associats Ltd.

(57) ABSTRACT

A memory device includes drain select lines, source select lines, a plurality of word lines arranged between the drain select lines and the source select lines, and a peripheral circuit configured to perform a program operation on selected memory cells connected to a selected word line among the plurality of word lines. The peripheral circuit includes a voltage generator configured to generate a voltage for initializing a channel of a plurality of memory cells respectively connected to the plurality of word lines in a program phase among a plurality of phases included in the program operation.

20 Claims, 18 Drawing Sheets

(56) References Cited

U.S. PATENT DOCUMENTS

| | | | |
|---|---|---|---|
| 2019/0318784 A1* | 10/2019 | Lee | G11C 11/5628 |
| 2020/0294571 A1* | 9/2020 | Shin | G11C 11/4085 |
| 2020/0357471 A1* | 11/2020 | Bae | G11C 16/0483 |
| 2020/0402584 A1* | 12/2020 | Lee | H01L 24/05 |
| 2021/0020254 A1* | 1/2021 | Kim | G11C 11/5628 |

* cited by examiner

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0002482, filed on Jan. 8, 2020, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under the control of a host device, such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a non-volatile memory.

The storage device may include a memory device in which data is stored and a memory controller that stores data in the memory device. The memory device may be classified as a volatile memory device or a non-volatile memory device. Here, the non-volatile memory device includes a read only memory (ROM), a programmable ROM (PROM), an electrically programmable ROM (EPROM), an electrically erasable and programmable ROM (EPM), a flash memory, a phase-change RAM (PRAM), a magnetic RAM (MRAM), a resistive RAM (RRAM), a ferroelectric RAM (FRAM) and the like.

SUMMARY

An embodiment of the present disclosure provides a memory device and a method of operating the same capable of reducing a program operation time by starting a channel initialization operation in a program phase of a program phase and a verify phase performed during a program operation of a memory device.

A memory device according to an embodiment of the present disclosure may include drain select lines, source select lines, a plurality of word lines arranged between the drain select lines and the source select lines, and a peripheral circuit configured to perform a program operation on selected memory cells connected to a selected word line among the plurality of word lines. The peripheral circuit may include a voltage generator configured to generate a voltage for initializing a channel of a plurality of memory cells respectively connected to the plurality of word lines in a program phase among a plurality of phases included in the program operation.

A memory device according to an embodiment of the present disclosure may include drain select lines, source select lines, a plurality of word lines arranged between the drain select lines and the source select lines, and a peripheral circuit configured to perform a program operation on selected memory cells connected to a selected word line among the plurality of word lines. The peripheral circuit may include a voltage generator configured to generate a channel initialization voltage to be applied to the plurality of word lines and a voltage to be applied to the drain select lines and source select lines, in order to initialize a channel of a plurality of memory cells respectively connected to the plurality of word lines, when a verify phase is performed immediately after generating a program voltage to be applied to the selected word line in a program phase among a plurality of phases included in the program operation.

A method of operating a memory device according to an embodiment of the present disclosure may be a method of operating a memory device including a plurality of word lines connected to a memory block, drain select lines and source select lines connected to the memory block adjacent to the plurality of word lines, and a peripheral circuit configured to perform a program operation on selected memory cells connected to a selected word line among the plurality of word lines. The method may include a program phase of applying a program voltage to the selected word line during the program operation, and verifying whether the selected memory cells reach a target program state after the program phase. The program phase may include a channel initialization phase of initializing a channel of a plurality of memory cells connected to the plurality of word lines, respectively.

According to the present technology, in the program phase and the verify phase performed during the program operation, a voltage of a specific level is applied to the drain select lines and the source select lines when a pass voltage is applied to the word lines to start a channel initialization operation. Therefore, a program operation time may be shortened.

DETAILED DESCRIPTION

Specific structural or functional descriptions of embodiments according to the concepts which are disclosed in the present specification or application are illustrated only to describe the embodiments according to the concepts of the present disclosure. The embodiments according to the concepts of the present disclosure may be carried out in various forms and the descriptions are not limited to the embodiments described in the present specification or application.

Hereinafter, embodiments of the present disclosure will be described with reference to the accompanying drawings so that those skilled in the art may implement the teachings of the present disclosure.

Figure 1:
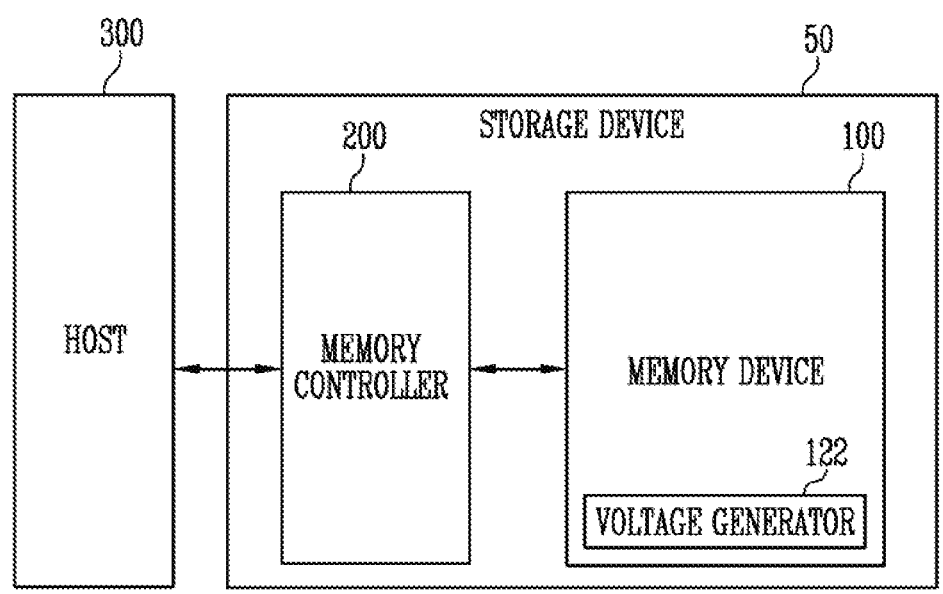
FIG. 1 is a block diagram for describing a storage device.

FIG. 1 is a block diagram for describing a storage device.

Referring to FIG. 1, the storage device 50 may include a memory device 100 and a memory controller 200.

The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multichip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device, in which a charge storage layer is configured of a conductive floating gate (FG), but also to a charge trap flash (CTF), in which the charge storage layer is configured of an insulating film.

In an embodiment, the memory device 100 may operate in a single-level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple-level cell (TLC) method of storing three data bits in one memory cell, or a quadruple-level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

In an embodiment, the memory device 100 may include a voltage generator 122. When the memory device 100 performs the program operation, the read operation, or the erase operation, the voltage generator 122 may generate voltages required for each operation. For example, the voltage generator 122 may generate a program voltage and a program verify voltage during the program operation, a read voltage and a pass voltage during the read operation, and an erase voltage and an erase verify voltage during the erase operation.

In an embodiment, during the program operation, the voltage generator 122 may generate the pass voltage to be applied to all word lines after generating the program voltage and the program pass voltage. The generated pass voltage may be applied to the word lines during a pass voltage maintenance period. The pass voltage maintenance period may be a period before a channel initialization operation is performed after the program voltage is applied to a selected word line and the program pass voltage is applied to unselected word lines.

Thereafter, the voltage generator 122 may generate a channel initialization voltage to be applied to the word lines and a voltage to be applied to the drain select lines and the source select lines before the verify operation. That is, the voltage generator 122 may generate voltages to be used for the channel initialization operation performed before the verify operation.

In the related art, voltages to be used for the channel initialization operation are generated and applied to respective lines after the pass voltage maintenance period. However, due to the pass voltage maintenance period, a lot of time is consumed for the program operation.

Therefore, in the present disclosure, a method of generating voltages to be used in the channel initialization operation and applying the voltages to respective lines at the same time as the pass voltage maintenance period is started or during the pass voltage maintenance period is presented.

The memory controller 200 may control overall operations of the storage device 50.

When a power voltage is applied to the storage device 50, the memory controller 200 may execute firmware FW. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and convert the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may converts the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide a command, an address, and data to the memory device 100 so as to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (DRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
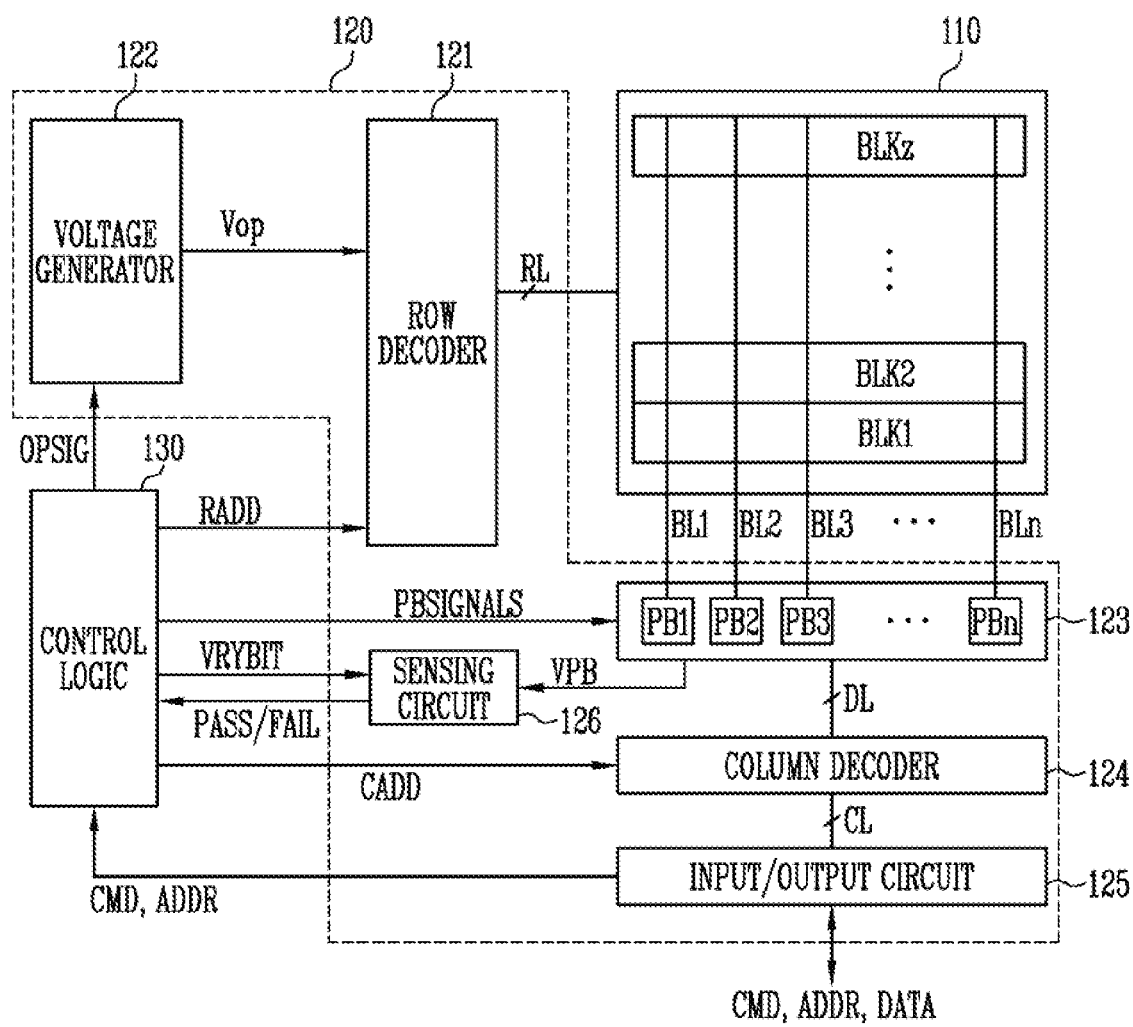
FIG. 2 is diagram for describing a structure of a memory device of FIG. 1.

FIG. 2 is diagram for describing a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single-level cell (SLC) that stores one data bit, a multi-level cell (MLC) that stores two data bits, a triple-level cell (TLC) that stores three data bits, or a quadruple-level cell (QLC) that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and apply a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, during the program operation, the voltage generator 122 may generate the program voltage and the program pass voltage to be applied to all word lines after generating the program voltage and the program pass voltage. However, because a program operation time may become long due to the pass voltage maintenance period, in the present disclosure, an operation of the voltage generator 122 to shorten the program operation time is presented.

For example, the voltage generator 122 may generate the channel initialization voltage and a drain source line voltage to be applied to respective lines at the same time as the pass voltage maintenance period is started or in the pass voltage maintenance period. The channel initialization voltage may be a voltage to be applied to the word lines as a voltage for starting the channel initialization operation, and the drain source line voltage may be a voltage to be applied to all drain select lines and all source select lines during the channel initialization operation.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn. The first to n-th page buffers PB1 to PBn are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL. The control logic 130 may be implemented as hardware, software, or a combination of hardware and software. For example, the control logic 130 may be a control logic circuit operating in accordance with an algorithm and/or a processor executing control logic code.

The memory cells included in the memory cell array 110 may be programmed to any one of a plurality of program states according to data stored in each memory cell. A target program state of the memory cell may be determined as any one of the plurality of program states according to data to be stored.

Figure 3:
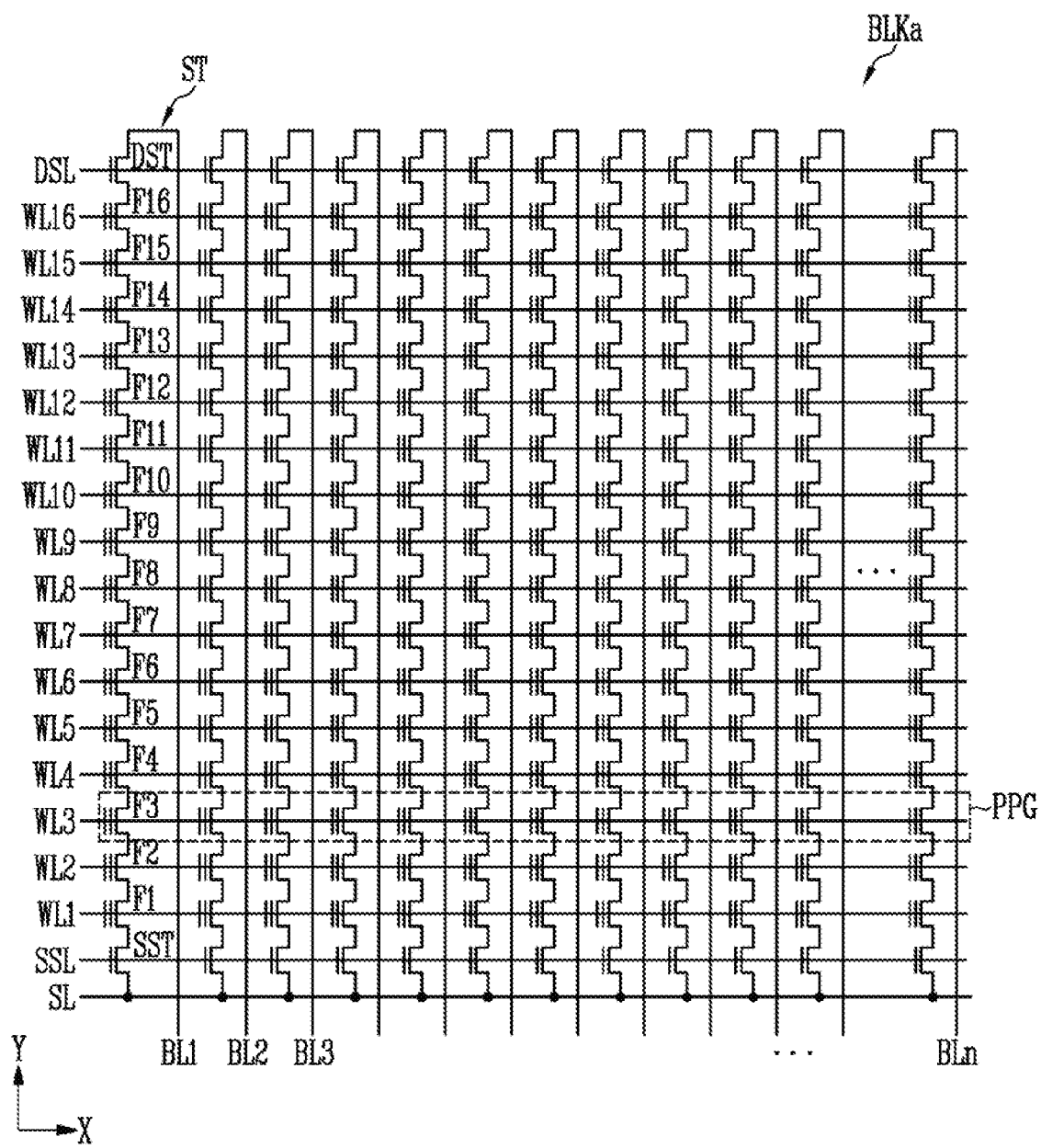
FIG. 3 is a diagram for describing a memory block.

FIG. 3 is a diagram for describing the memory block.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Because the strings may be configured to be identical to each other, a string ST connected to the first bit line BL1 will be specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as a single-level cell (SLC). In this case, one physical page PPG may store one logical page (LPG) data. One logical page (LPG) data may include data bits of the number of memory cells included in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell increases, the multi-level cell (MLC) refers to a memory cell in which two bits of data is stored, a memory cell in which three or more bits of data are stored is referred to as a triple-level cell (TLC), and a memory cell in which four or more bits of data are stored is referred to as a quadruple-level cell (QLC). In addition, a memory cell method in which a plurality of bits of data are stored has been developed, and the present embodiment may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
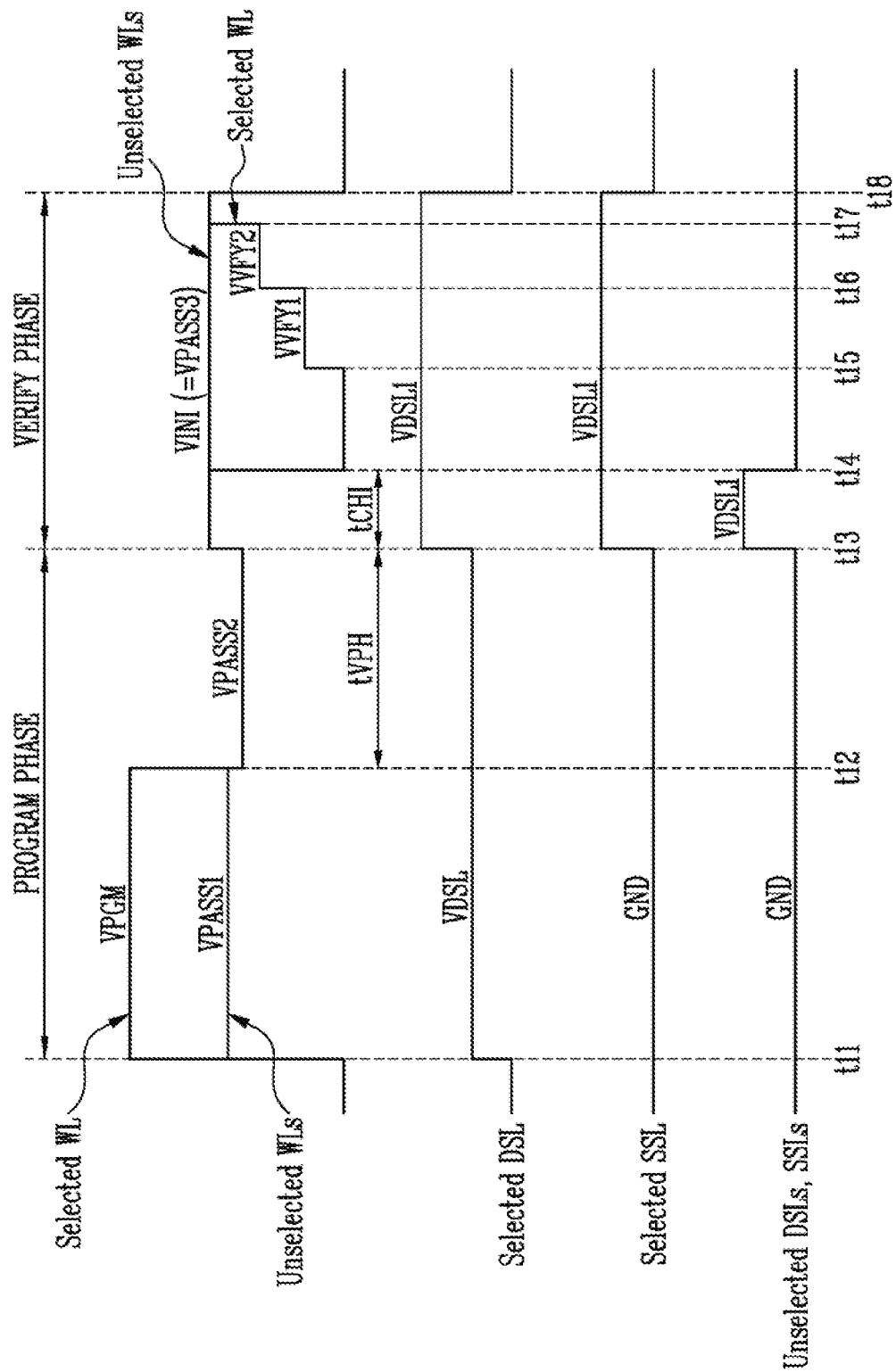
FIG. 4 is a diagram for describing voltages applied to respective lines during a program operation.

FIG. 4 is a diagram for describing the voltages applied to the respective lines during the program operation.

Referring to FIG. 4, FIG. 4 shows any one of a plurality of program loops performed during the program operation by the memory device 100 of FIG. 1. Each of the plurality of program loops may include a program phase PROGRAM PHASE and a verify phase VERIFY PHASE. Therefore, FIG. 4 shows the program phase PROGRAM PHASE and the verify phase VERIFY PHASE included in any one of the plurality of program loops.

Because the program operation includes the program phase PROGRAM PHASE and the verify phase VERIFY PHASE, the program operation time may be a sum of a time consumed in each phase. When the verify operation is failed to pass in the verify phase VERIFY PHASE, the program operation time may be a sum of a time consumed in performing the program phase PROGRAM PHASE and the verify phase VERIFY PHASE included in the next program loop. That is, the program operation time may be a time consumed performing the plurality of program loops until the verify phase VERIFY PHASE is passed.

In an embodiment, in a program pulse application phase t11 to t12 of the program phase PROGRAM PHASE, a program permission voltage or a program prohibition voltage is applied to the bit lines according to data input to the page buffers, and a program voltage VPGM may be applied to a selected word line Selected WL, and a first pass voltage VPASS1 may be applied to unselected word lines Unselected WLs. The selected memory cell among the memory cells connected to the selected word line Selected WL may be programmed, by applying the program voltage VPGM to the selected word line Selected WL in a state in which the program permission voltage or the program prohibition voltage is applied to the bit lines. For example, a string to which the program permission voltage is applied may be a selected string, and a string to which the program prohibition voltage is applied may be an unselected string. Among the memory cells connected to the selected word line Selected WL, the memory cells included in the selected strings may be programmed.

At t11 to t12, a drain select line voltage VDSL may be applied to a selected drain select line Selected DSL to program the memory cell included in the selected string among the plurality of strings. That is, a positive voltage higher than 0V may be applied to the selected drain select line Selected DSL to turn on a drain select transistor connected to the selected drain select line Selected DSL.

In addition, during the program operation, because a ground voltage GND may be applied to the source line SL of FIG. 3, the ground voltage GND, that is, 0V may be applied to a selected source select line Selected SSL. When the ground voltage GND is applied to the selected source select line Selected SSL, because a source select transistor connected to the selected source select line Selected SSL is turned off, the program prohibition voltage may be applied to a channel of the unselected strings.

0V, which is the ground voltage GND, may also be applied to the unselected drain select lines and unselected source select lines Unselected DSLs and SSLs. That is, 0V may be applied to the unselected drain select lines and unselected source select lines Unselected DSLs and SSLs so that the unselected memory cells are not programmed.

When the program voltage VPGM is applied to the selected word line Selected WL for a predetermined time, a second pass voltage VPASS2 may be applied to all word lines Selected WL and Unselected WLs at t12 to t13(tVPH). The tVPH period may be the pass voltage maintenance period. That is, after applying the program voltage VPGM to the selected word line Selected WL, before the verify phase VERIFY PHASE proceeds, voltage levels applied to all word lines may be set to be the same.

In order to set the voltages of all word lines Selected WL and Unselected WLs to be the same voltage level, the second pass voltage VPASS2 may be applied to all word lines Selected WL and Unselected WLs. When the voltage levels of all word lines Selected WL and Unselected WLs are the same as the second pass voltage VPASS2, an operation for a channel initialization may be performed.

That is, after applying a channel initialization voltage VINI to all word lines Selected WL and Unselected WLs, the selected word line Selected WL may be discharged, and the voltage applied to the unselected word lines Unselected WLs may maintain the channel initialization voltage VINI. At this time, the channel initialization voltage VINI may be a third pass voltage VPASS3.

Because a discharge operation is performed in a state in which the voltages of all word lines Selected WL and Unselected WLs are the same, coupling between different word lines does not occur. Therefore, a phenomenon in which a voltage of some word lines is relatively lower or higher than other word lines may be prevented.

In an embodiment, at t13, when the program phase PROGRAM PHASE is ended, the verify phase VERIFY PHASE may proceed.

At t13 to t14(tCHI) during the verify phase VERIFY PHASE, the channel initialization operation may be performed. tCHI may be the channel initialization period. When the channel initialization operation is performed, the channel initialization voltage VINI may be applied to all word lines Selected WL and Unselected WLs, and a first drain source line voltage VDSL1 may be applied to all drain select lines Selected DSL and SSL, and Unselected DSLs and SSLs. That is, the channel of the memory cells may be initialized before the verify voltage is applied to the selected word line.

Thereafter, at t14 to t15, the voltage of the selected word line Selected WL may become 0V. That is, before performing the verify operation, the voltage level of the selected word line WL may be set to a level of the channel initialization voltage VINI, and then discharged, to set to 0V. At this time, because the verify operation is quickly performed when the voltage of the unselected word lines Unselected WLs is maintained as the third pass voltage VPASS3, the voltage applied to the unselected word lines Unselected WLs may be maintained as the third pass voltage VPASS3.

At t14-t15, the unselected drain select lines and unselected source select lines Unselected DSLs and SSLs are discharged, and thus the voltage of the unselected drain select lines and unselected source select lines Unselected DSLs and SSLs may become 0V. That is, in order to prevent the unselected drain select lines and unselected source select lines Unselected DSLs and SSLs from becoming a specific voltage level, after the first drain source line voltage VDSL1 is applied to the unselected drain select lines and unselected source select lines Unselected DSLs and SSLs at t13-t14, the unselected drain select lines and unselected source select lines Unselected DSLs and SSLs may be discharged.

The verify operation may be performed from t15. For example, the first verify voltage VVFY1 may be applied to the selected word lines Selected WL at t15 to t16, and the second verify voltage VVFY2 may be applied to the selected word line Selected WL at t16 to t17. Through the verify operation, it may be determined whether the memory cells reach a target program state. At this time, the voltage applied to the unselected word lines WLs may be maintained as the third pass voltage VPASS3 at t15 to t17.

At t17 to t18, the third pass voltage may be applied to all word lines Selected WL and Unselected WLs, and all word lines Selected WL and Unselected WLs may be simultaneously discharged. That is, an equalizing operation may be performed. After t18 the verify phase is ended, all word lines Selected WL and Unselected WLs, all drain select lines and all source select lines Selected DSL and SSL and Unselected DSLs and SSLs may be discharged and may reach 0V.

In an embodiment, when the selected memory cell passes the verify operation, the program operation may be ended. However, when the selected memory cell does not pass the verify operation, the next program loop may proceed.

Among the above-described t1 to t18 periods, a time consumed for the program operation may become longer due to the pass voltage maintenance period tVPH, that is, t12 to t13 period. Therefore, in order to shorten the time consumed for the program operation, in an embodiment described below, a method of omitting the pass voltage maintenance period tVPH and immediately performing the channel initialization operation, or a method of performing the channel initialization operation at the same time as the pass voltage maintenance period tVPH is started or during the pass voltage maintenance period tVPH is presented.

Figure 5:
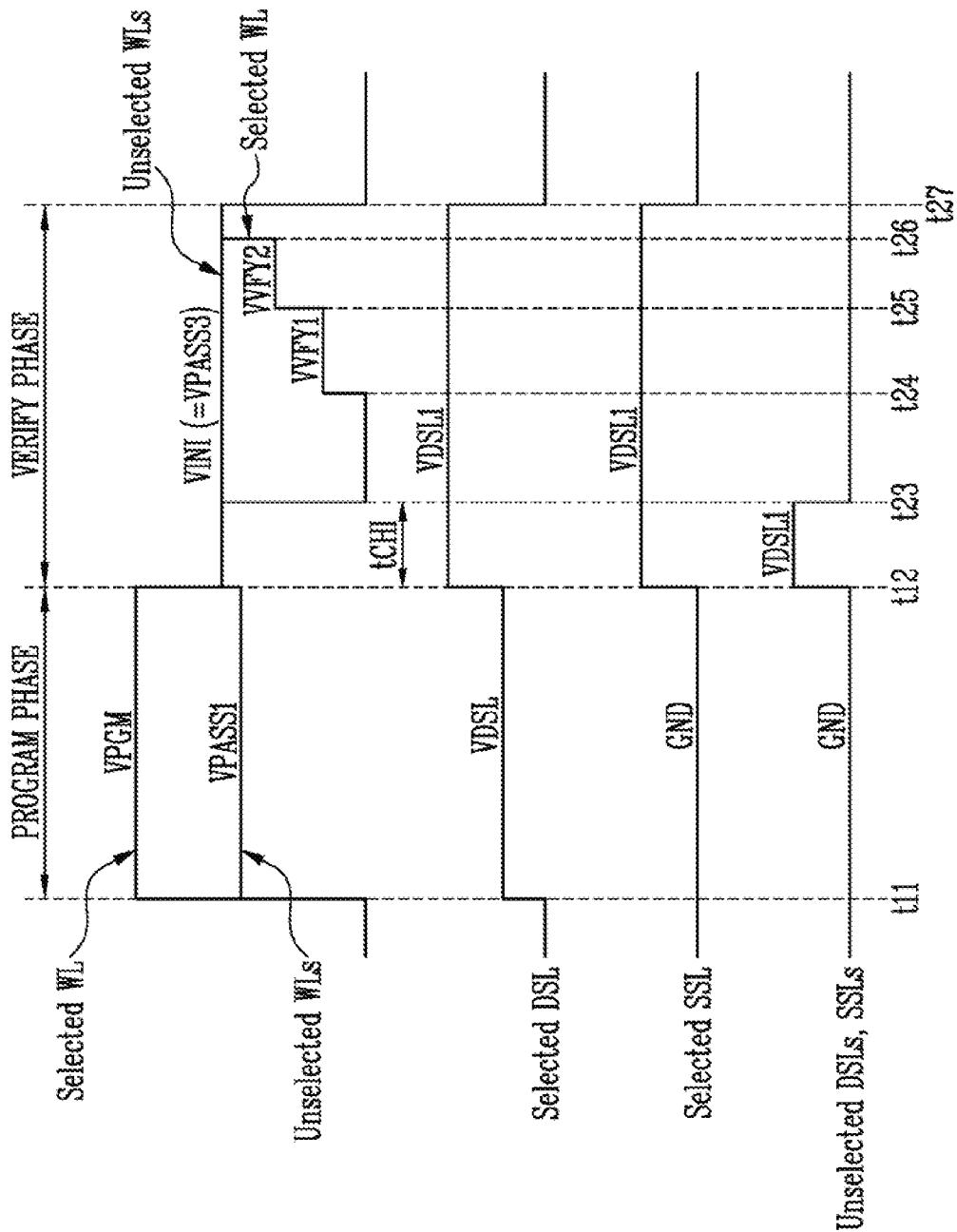
FIG. 5 is a diagram for describing the voltages applied to the respective lines when a channel initialization operation is immediately performed without a pass voltage maintenance period.

FIG. 5 is a diagram for describing the voltages applied to the respective lines when the channel initialization operation is immediately performed without the pass voltage maintenance period.

Referring to FIGS. 4 and 5, FIG. 5 shows a case where the pass voltage maintenance period tVPH of FIG. 4 is omitted and the channel initialization operation is immediately performed. Because FIG. 5 is the same as FIG. 4 except that the pass voltage maintenance period tVPH is omitted, repetitive description will be omitted.

Referring to FIG. 5, in the program phase PROGRAM PHASE, the program voltage VPGM may be applied to the selected word line Selected WL, the first pass voltage VPASS1 may be applied to the unselected word lines Unselected WLs, the drain select line voltage VDSL may be applied to the selected drain select line Selected DSL, and the ground voltage GND may be applied to the selected source select line Selected SSL, and the unselected drain select lines and unselected source select lines Unselected DSLs and SSLs.

However, when the program pulse application phase t11 to t12 is ended, the channel initialization operation may be immediately performed without the pass voltage maintenance period tVPH in which the same voltage is applied to all word lines Selected WL and Unselected WLs. That is, the program phase PROGRAM PHASE is ended at t12 without the pass voltage maintenance period tVPH, and the channel initialization operation may be performed at the subsequent verify phase VERIFY PHASE.

Therefore, after the program pulse application phase t11 to t12, the channel initialization operation may be performed at t12 to t23, that is, during the channel initialization period tCHI. At t12 to t23, the channel initialization voltage VINI may be applied to all word lines Selected WL and Unselected WLs, and the first drain source line voltage VDSL1 may be applied to all drain select lines and all source select lines Selected DSL and SSL and Unselected DSLs and SSLs. That is, the channel of the memory cells may be initialized before the verify voltage is applied to the selected word line.

The voltage applied to each line after the channel initialization operation is performed is the same as that of FIG. 4.

As a result, because the time consumed in the program phase may be shortened by omitting the pass voltage maintenance period tVPH, the time consumed for the entire program operation may be shortened.

The time shortened by omitting the pass voltage maintenance period tVPH will be described in more detail with reference to FIG. 6.

Figure 6:
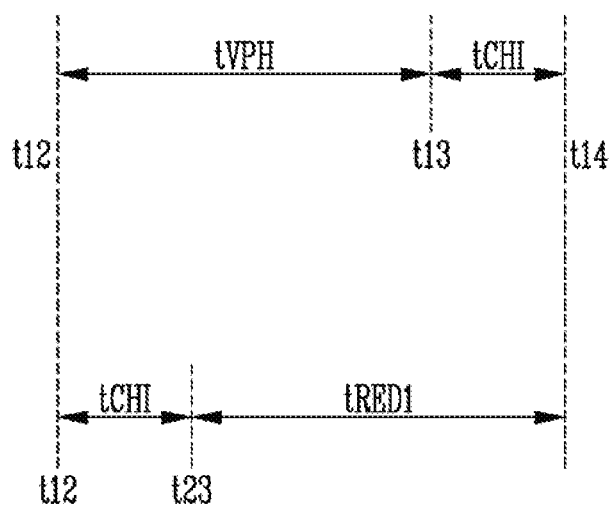
FIG. 6 is a diagram for describing a program time shortened during the program operation of FIG. 5.

FIG. 6 is a diagram for describing a program time shortened during the program operation of FIG. 5.

Referring to FIGS. 4, 5 and 6, FIG. 6 shows t12 to t14 of t12 to t18 of FIG. 4 and a time of FIG. 5 overlapping t12 to t14.

Referring to FIG. 4, in an embodiment, the pass voltage maintenance period tVPH may be included in the program phase PROGRAM PHASE. In this case, at t12, the pass voltage maintenance period tVPH may be started. Therefore, when the pass voltage maintenance period tVPH is started at t12, the pass voltage maintenance period tVPH may be ended at t13, and the channel initialization operation may be performed at the channel initialization period tCHI, that is, at t13 to t14.

However, when the pass voltage maintenance period tVPH is not included in the program phase PROGRAM PHASE, that is, when the pass voltage maintenance period tVPH is omitted, the channel initialization operation may be started at t12. When the pass voltage maintenance period tVPH is not included in the program phase PROGRAM PHASE, the channel initialization operation may be performed during the channel initialization period tCHI, that is, t12 to t23. As a result, because the channel initialization operation is immediately performed without the pass voltage maintenance period tVPH, the program operation time by the pass voltage maintenance period tVPH may be shortened.

Therefore, when the pass voltage maintenance period tVPH is omitted, because the channel initialization operation is performed at t12 to t23 and the verify operation is started at t23, the program operation time may be shortened by the period t23 to t14, that is, a first shorten time tRED1.

Figure 7:
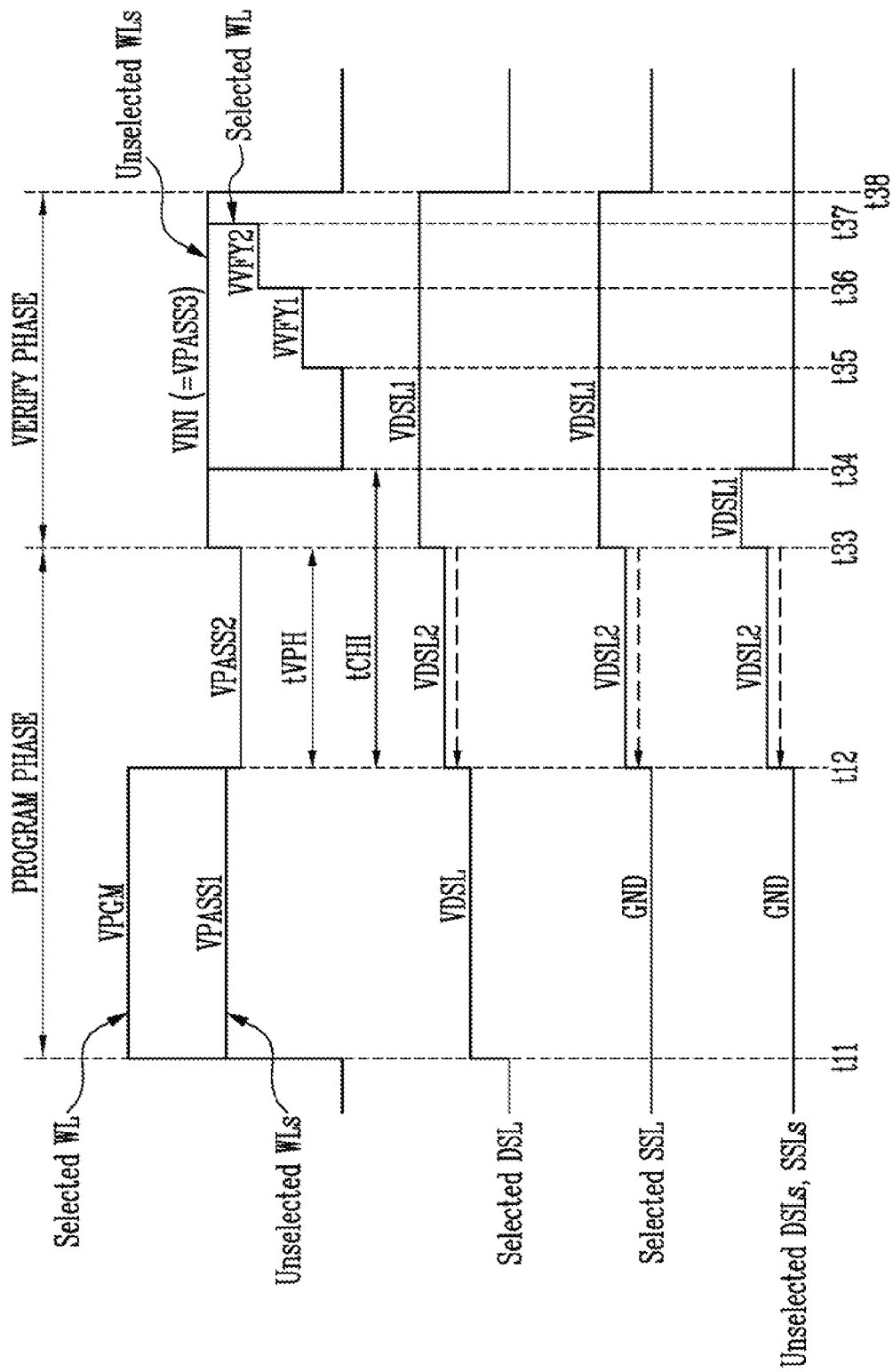
FIG. 7 is a diagram for describing the voltages applied to the respective lines when the channel initialization operation is performed at the same time as the pass voltage maintenance.

FIG. 7 is a diagram for describing the voltages applied to the respective lines when the channel initialization operation is performed at the same time as the pass voltage maintenance.

Referring to FIG. 7, FIG. 7 shows a case where the channel initialization operation is performed at the same time as the pass voltage maintenance is started. Because FIG. 7 is the same as FIG. 4 except that the channel initialization operation is performed at the same time as the pass voltage maintenance is started, repetitive description will be omitted.

Referring to FIG. 7, in the program phase PROGRAM PHASE, the program voltage VPGM may be applied to the selected word line Selected WL, the first pass voltage VPASS1 may be applied to the unselected word lines Unselected WLs, the drain select line voltage VDSL may be applied to the selected drain select line Selected DSL, and the ground voltage GND may be applied to the selected source select line Selected SSL, and the unselected drain select lines and unselected source select lines Unselected DSLs and SSLs.

In the program phase PROGRAM PHASE, when the program pulse application phase t11 to t12 is ended, the pass voltage maintenance period tVPH in which the same voltage is applied to all word lines Selected WL and Unselected WLs may be started.

However, differently from FIG. 4, in FIG. 7, the second drain source line voltage VDSL2 may be applied to all drain select lines and all source select lines Selected DSL and SSL and Unselected DSLs and SSLs. That is, the channel initialization period tCHI may be also started while the pass voltage maintenance period tVPH is started.

At this time, the second drain source line voltage VDSL2 may be greater than a threshold voltage of the drain select transistors respectively connected to the drain select lines and the source select transistors respectively connected to the source select lines and may be less than the first drain source line voltage VDSL1.

That is, in order to turn on the drain select transistors and the source select transistors, a magnitude of the second drain source line voltage VDSL2 is required to be greater than the threshold voltage of the drain select transistors and the source select transistors. However, the magnitude of the second drain source line voltage VDSL2 is required to be less than the first drain source line voltage VDSL1 set for the channel initialization, before the channel initialization voltage VINI is applied to all word lines Selected WL and Unselected WLs.

That is, the first drain source line voltage VDSL1 may be applied to all drain select lines and all source select lines Selected DSL and SSL and Unselected DSLs and SSLs by applying the channel initialization voltage VINI to all word lines Selected WL and Unselected WLs after setting the voltage applied to all drain select lines and all source select lines Selected DSL and SSL and Unselected DSLs and SSLs) to a specific level during the pass voltage maintenance period tVPH. Therefore, a time consumed to set the voltage of all drain select lines and all source select lines Selected DSL and SSL and Unselected DSLs and SSLs to the first drain source line voltage VDSL1 may be shortened.

As a result, because the time consumed in the program phase may be shortened because the channel initialization operation is started as the pass voltage maintenance period tVPH is started, the time consumed for the entire program operation may be shortened.

The time shortened by starting the channel initialization operation as the pass voltage maintenance period tVPH is started will be described in more detail with reference to FIGS. 8 to 10.

Figure 8:
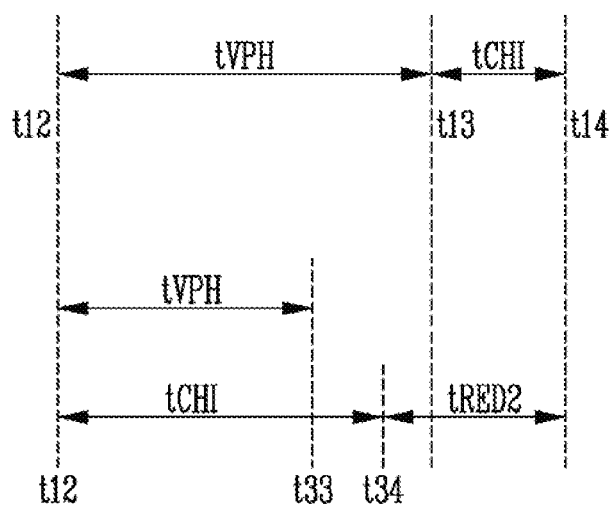
FIG. 8 is a diagram for describing an embodiment of the program time shortened during the program operation by FIG. 7.

FIG. 8 is a diagram for describing an embodiment of the program time shortened during the program operation by FIG. 7.

Referring to FIGS. 4, 7 and 8, FIG. 8 shows t12 to t14 of t12 to t18 of FIG. 4 and a time of FIG. 7 overlapping t12 to t14 of FIG. 4.

In the related art, the channel initialization operation is performed after the pass voltage maintenance period tVPH in which the voltage of all word lines Selected WL and Unselected WLs are maintained as the second pass voltage VPASS2 elapses. However, in the present disclosure, a method of performing the channel initialization operation at the same time as the pass voltage maintenance period tVPH is started is presented. That is, in the related art, the pass voltage is maintained at t12 to t13 (tVPH) and the channel initialization operation is performed at t13 to t14(tCHI). However, in the present disclosure, the initialization operation may also be started at the same time as the pass voltage maintenance period tVPH is started at t12.

In an embodiment, at t12, the first drain source line voltage VDSL1 may be applied to all drain select lines and all source select lines Selected DSL and SSL and Unselected DSLs and SSLs at the same time as the voltage of all word lines Selected WL and Unselected WLs are maintained as the second pass voltage VPASS2. That is, during the program operation of the prior art, the channel initialization operation is performed at t13 to t14 after the pass voltage maintenance period tVPH is ended. However, in a case of the present disclosure, at t12, the channel initialization operation may also be started at the same time as the pass voltage maintenance period tVPH is started.

In an embodiment, after the voltage of all drain select lines and all source select lines Selected DSL and SSL and Unselected DSLs and SSLs are set to the first drain source line voltage VDSL1, the pass voltage maintenance period tVPH may be ended at t33.

When the pass voltage maintenance period tVPH is ended at t33, the voltage of all word lines Selected WL and Unselected WLs, and the unselected drain select lines and source select lines Unselected DSLs and SSLs may become the ground voltage (0V), after the channel initialization voltage VINI is applied to all word lines Selected WL and Unselected WLs and the first drain source line voltage VDSL1 is applied to all drain select lines and all source select lines Selected DSL and SSL and Unselected DSLs and SSLs, and thus the channel initialization operation may be ended.

In FIG. 8, the channel initialization operation according to the present disclosure may be performed during a channel initialization period t12 to t34. At this time, a time point t34 at which the channel initialization operation of the present disclosure is completed may be earlier than a time point t13 at which the pass voltage maintenance period tVPH of the related art is completed. In this case, the time consumed for the entire program operation may be shortened by a second shorten time tRED2. That is, the time consumed for the entire program operation may be reduced by the period t34 to t14.

As a result, according to the present disclosure, when the channel initialization operation is performed at the same time as the pass voltage maintenance period tVPH is started, the channel initialization operation may be performed at t12 to t34, and the verify operation may be started at t34. Therefore, the program operation time may be shortened by the period t34 to t14, that is, the second shorten time tRED2.

Figure 9:
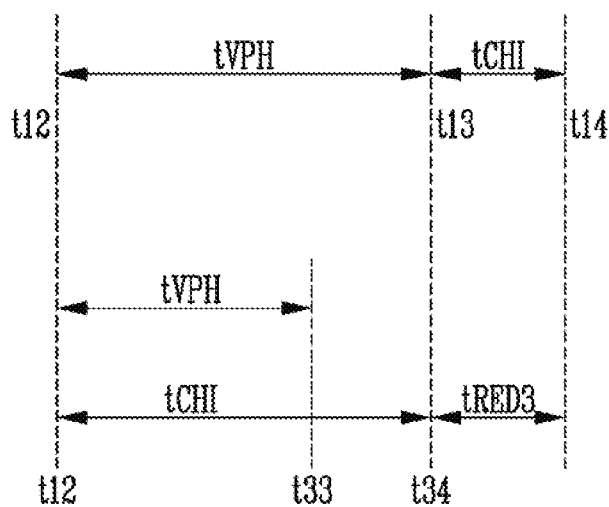
FIG. 9 is a diagram for describing another embodiment of the program time shortened during the program operation by FIG. 7.

FIG. 9 is a diagram for describing another embodiment of the program time shortened during the program operation by FIG. 7.

Referring to FIGS. 4, 7, and 9, FIG. 9 shows t12 to t14 of t12 to t18 of FIG. 4 and the time of FIG. 7 overlapping t12 to t14 of FIG. 4.

Referring to FIGS. 7 to 9, FIG. 9 shows the program time shorted when the channel initialization operation is started at the same time as the pass voltage maintenance period tVPH is started and the channel initialization period tCHI of the present disclosure is the same period as the existing pass voltage maintenance period tVPH, in FIG. 7.

Because FIG. 9 is the same as FIG. 8 except that the channel initialization period tCHI according to the present disclosure is the same as the existing pass voltage maintenance period tVPH, repetitive description will be omitted.

When the pass voltage maintenance period tVPH is ended at t33, the voltage of all word lines Selected WL and Unselected WLs, and the unselected drain select lines and source select lines Unselected DSLs and SSLs may become the ground voltage (0V), after the channel initialization voltage VINI is applied to all word lines Selected WL and Unselected WLs and the first drain source line voltage VDSL1 is applied to all drain select lines and all source select lines Selected DSL and SSL and Unselected DSLs and SSLs, and thus the channel initialization operation may be ended.

In FIG. 9, the channel initialization operation according to the present disclosure may be performed during the channel initialization period t12 to t34. At this time, the time point t34 at which the channel initialization operation of the present disclosure is completed may be the same as the time point t13 at which the pass voltage maintenance period tVPH of the related art is completed. In this case, the time consumed for the entire program operation may be shortened by a third shorten time tRED3. That is, the time consumed for the entire program operation may be reduced by the time t34 to t14 that is consumed for the channel initialization operation of the related art.

Referring to FIG. 8, the third shorten time tRED3 may be shorter than the second shorten time tRED2 of FIG. 8.

As a result, according to the present disclosure, when the channel initialization operation is performed at the same time as the pass voltage maintenance period tVPH is started, the channel initialization operation may be performed at t12 to t34, and the verify operation may be started at t34. Therefore, the program operation time may be shortened by the period t34 to t14, that is, the third shorten time tRED3.

Figure 10:
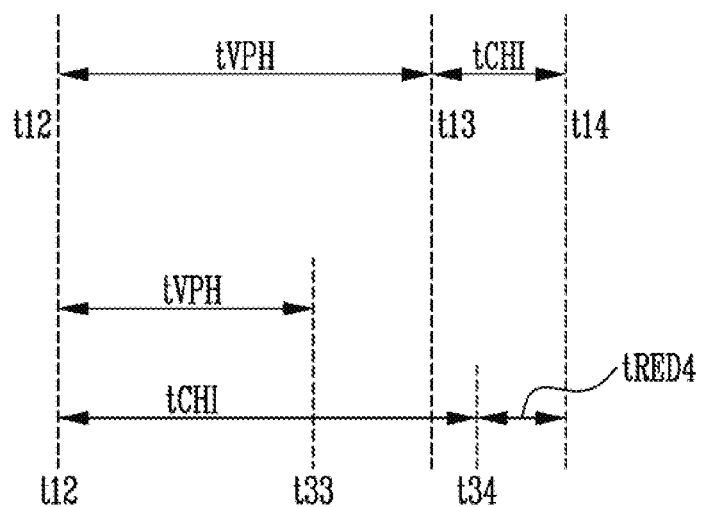
FIG. 10 is a diagram for describing another embodiment of the program time shortened during the program operation by FIG. 7.

FIG. 10 is a diagram for describing another embodiment of the program time shortened during the program operation by FIG. 7.

Referring to FIGS. 4, 7 and 10, FIG. 10 shows t12 to t14 of t12 to t18 of FIG. 4 and the time of FIG. 7 overlapping t12 to t14 of FIG. 4.

Referring to FIGS. 7 to 10, FIG. 10 shows the program time shorted when the channel initialization operation is started at the same time as the pass voltage maintenance period tVPH is started and the channel initialization period tCHI of the present disclosure is longer than the existing pass voltage maintenance period tVPH.

Because FIG. 10 is the same as FIGS. 8 and 9 except that the channel initialization period tCHI according to the present disclosure is longer than the existing pass voltage maintenance period tVPH, repetitive description will be omitted.

When the pass voltage maintenance period tVPH is ended at t33, the voltage of all word lines Selected WL and Unselected WLs, and the unselected drain select lines and source select lines Unselected DSLs and SSLs may become the ground voltage (0V), after the channel initialization voltage VINI is applied to all word lines Selected WL and Unselected WLs and the first drain source line voltage VDSL1 is applied to all drain select lines and all source select lines Selected DSL and SSL and Unselected DSLs and SSLs, and thus the channel initialization operation may be ended.

In FIG. 10, the channel initialization operation according to the present disclosure may be performed during the channel initialization period t12 to t34. At this time, the time point t34 at which the channel initialization operation of the present disclosure is completed may be after the time point t13 at which the pass voltage maintenance period tVPH of the related art is completed. In this case, the time consumed for the entire program operation may be shortened by a fourth shorten time tRED4.

Referring to FIG. 9, the fourth shorten time tRED4 may be shorter than the third shorten time tRED3 of FIG. 9.

As a result, according to the present disclosure, when the channel initialization operation is performed at the same time as the pass voltage maintenance period tVPH is started, the channel initialization operation may be performed at t12 to t34, and the verify operation may be started at t34. Therefore, the program operation time may be shortened by the period of t34 to t14, that is, the fourth shorten time tRED4.

Figure 11:
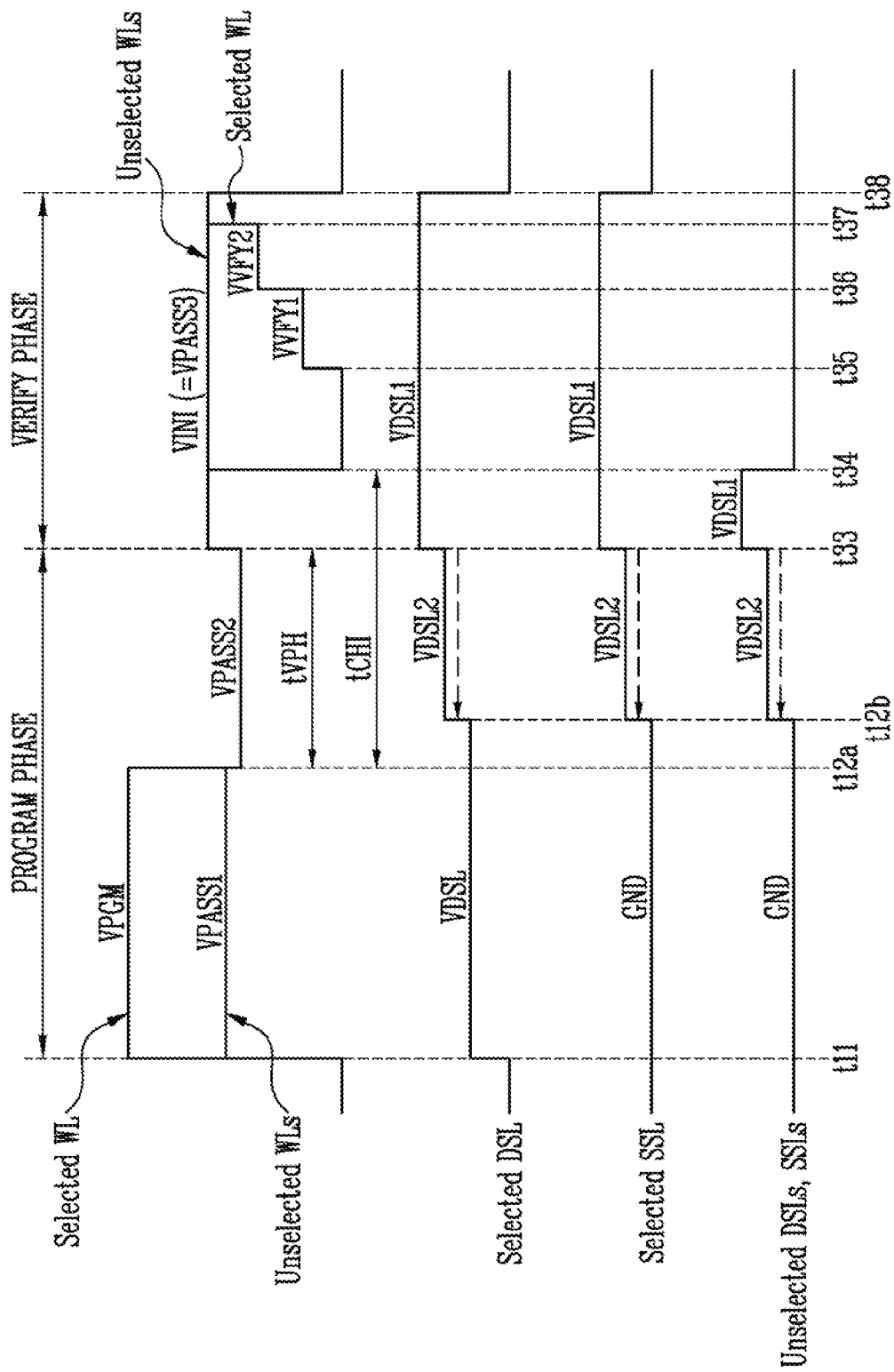
FIG. 11 is a diagram for describing the voltages applied to the respective lines when the channel initialization operation is started in the pass voltage maintenance period of FIG. 7.

FIG. 11 is a diagram for describing the voltages applied to the respective lines when the channel initialization operation is started in the pass voltage maintenance period of FIG. 7.

Referring to FIGS. 7 and 11, FIG. 11 shows a case where the channel initialization is started in the pass voltage maintenance period tVPH. Because FIG. 11 is the same as FIG. 7 except that the channel initialization operation is performed in the pass voltage maintenance period tVPH, repetitive description will be omitted.

Referring to FIG. 11, in the program phase PROGRAM PHASE, the program voltage VPGM may be applied to the selected word line Selected WL, the first pass voltage VPASS1 may be applied to the unselected word lines Unselected WLs, the drain select line voltage VDSL may be applied to the selected drain select line Selected DSL, and the ground voltage GND may be applied to the selected source select line Selected SSL, and the unselected drain select lines and unselected source select lines Unselected DSLs and SSLs.

In the program phase PROGRAM PHASE, when the program pulse application phase t11 to t12a is ended, the pass voltage maintenance period tVPH in which the same voltage is applied to all word lines Selected WL and Unselected WLs may be started.

However, even though the pass voltage maintenance period tVPH is started, the channel initialization period tCHI might not be immediately started, but the channel initialization period tCHI may be started after a preset time t12a to t12b elapses. That is, differently from FIG. 7, after the pass voltage maintenance period tVPH is started, when the preset time t12a to t12b elapses, the second drain source line voltage VDSL2 may be applied to all drain select lines and all source select lines Selected DSL and SSL and Unselected DSLs and SSLs.

As a result, after the pass voltage maintenance period tVPH is started, the channel initialization operation is started when the preset time t12a to t12b elapses, and thus the time consumed for the program operation may be consumed by the preset time t12a to t12b in comparison with FIG. 7. That is, during the program operation, a time obtained by subtracting the preset time t12a to t12b from the second to fourth shorten times tRED2 to tRED4 described with reference to FIGS. 8 to 10 may be shortened.

Figure 12:
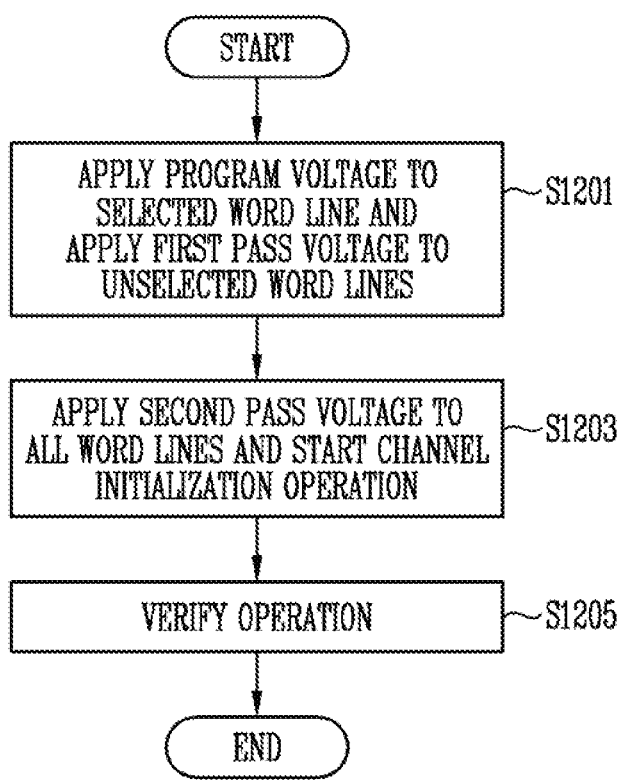
FIG. 12 is a diagram for describing an operation of the memory device according to an embodiment.

FIG. 12 is a diagram for describing an operation of the memory device according to an embodiment.

Referring to FIG. 12, in step S1201, the memory device may apply the program voltage to the selected word line, and apply the first pass voltage to the unselected word lines. The first pass voltage may be lower than the program voltage, and may be a voltage applied to the unselected word lines so that the memory cells connected to the unselected word lines are not programmed. Step S1201 may be the program pulse application phase. Thereafter, the verify phase may be performed through the pass voltage maintenance period.

In step S1203, the memory device may start the channel initialization operation at the same time as applying the second pass voltage to all word lines. In the present disclosure, because the memory device may start the channel initialization operation at the same time as starting the pass voltage maintenance period, the memory device may apply the second drain source line voltage to all drain select lines and all source select lines while applying the second pass voltage to all word lines. The second drain source line voltage may be a voltage for turning on the drain select transistors respectively connected to all drain select lines and the source select transistors respectively connected to all source select lines.

In an embodiment, after applying the second pass voltage to all word lines, the memory device may start the channel initialization operation when the preset time elapses. In this case, when the preset time elapses, the memory device may apply the second drain source line voltage to all drain select lines and all source select lines while applying the second pass voltage to all word lines, and the time consumed for the program operation may be further consumed by the preset time.

After the pass voltage maintenance period is ended, the memory device may perform the verify phase. In the verify phase, the memory device may perform the channel initialization operation by applying the channel initialization voltage to all word lines and then discharging the selected word line.

When the channel initialization operation is ended, the memory device may perform the verify operation to check whether the selected memory cell reaches the program state (S1205).

Figure 13:
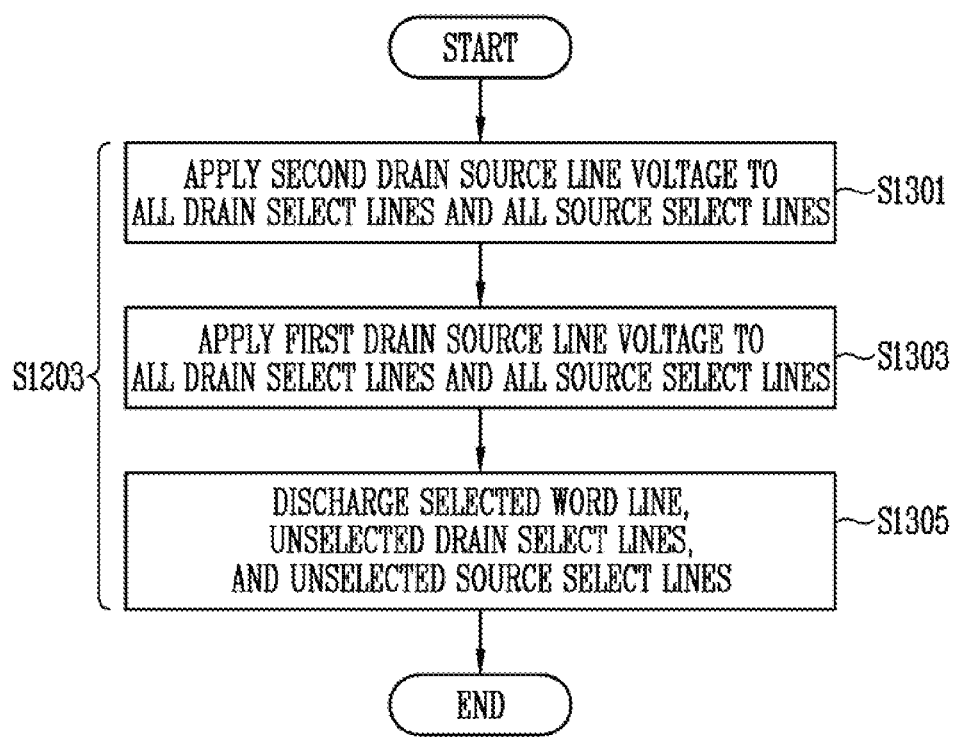
FIG. 13 is a diagram for describing the operation of the memory device according to an embodiment.

FIG. 13 is a diagram for describing the operation of the memory device according to an embodiment.

Referring to FIGS. 12 and 13, steps S1301 to S1305 are steps subdividing step S1203. That is, steps S1301 to S1305 are steps for describing a method of starting the channel initialization operation at the same time as applying the second pass voltage to all word lines in detail.

In step S1301, the memory device may apply the second drain source line voltage to all drain select lines and all source select lines. That is, when the program pulse application phase in which the program voltage is applied to the selected word line and the pass voltage is applied to the unselected word lines is ended, the memory device may start the channel initialization operation together with the pass voltage maintenance.

The pass voltage maintenance period may be ended after the voltage of all drain select lines and all source select lines become the second drain source line voltage. That is, the program phase may be ended and the verify phase may proceed. At this time, in the verify phase, the memory device may apply the first drain source line voltage to all drain select lines and all source select lines while applying the channel initialization voltage to all word lines (S1303). The first drain source line voltage may be a voltage applied to all drain select lines and all source select lines when the channel of the memory cells is initialized, and may be greater than the second drain source line voltage.

Thereafter, in step S1305, the memory device may discharge the selected word line, the unselected drain select lines, and the unselected source select lines. As the selected word line, the unselected drain select lines, and the unselected source select lines are discharged, the channel initialization operation may be ended.

Figure 14:
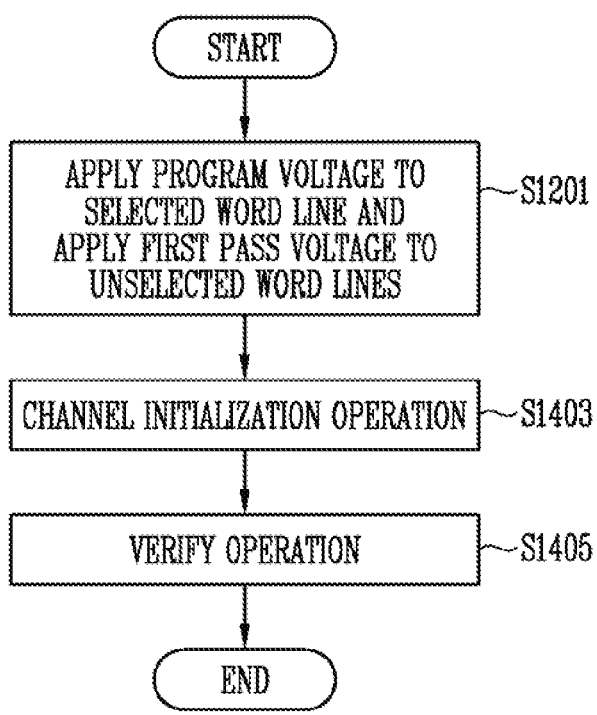
FIG. 14 is a diagram for describing the operation of the memory device according to an embodiment.

FIG. 14 is a diagram for describing the operation of the memory device according to an embodiment.

Referring to FIGS. 12 and 14, in step S1201, the memory device may apply the program voltage to the selected word line, and apply the first pass voltage to the unselected word lines. The first pass voltage may be lower than the program voltage, and may be a voltage applied to the unselected word lines so that the memory cells connected to the unselected word lines are not programmed. Step S1201 may be the program pulse application phase. Thereafter, the verify phase may be performed through the pass voltage maintenance period.

In FIG. 14, an operation of applying the second pass voltage to all word lines may be omitted during step S1203 of FIG. 12. That is, the memory device may perform the channel initialization operation without the pass voltage maintenance period (S1403). That is, the pass voltage maintenance period may be omitted in the program phase, and the verify phase may immediately proceed.

Therefore, when the program pulse application phase is ended, the memory device may proceed to the verify phase to apply the channel initialization voltage to all word lines and to apply the first drain source line voltage to all drain select lines and all source select lines. Therefore, memory device may perform the channel initialization operation.

Thereafter, when the memory device discharges the selected word line, the unselected drain select lines and source select lines, the channel initialization operation may be ended, and the memory device may perform the verify operation (S1405). The verify operation may be an operation for checking whether the selected memory cell reaches the target program state.

Figure 15:
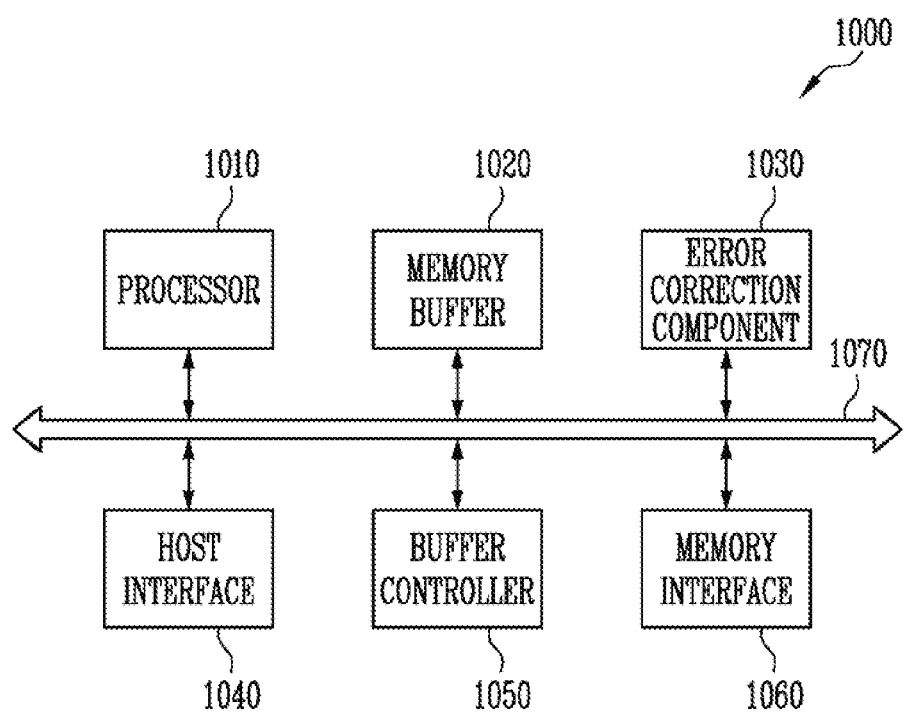
FIG. 15 is a diagram for describing another embodiment of the memory controller of FIG. 1.

FIG. 15 is a diagram for describing another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 15, the memory controller 1000 may include a processor 1010, a memory buffer 1020, an error correction component (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of a flash translation layer (FTL). The processor 1010 may convert a logical block address (LBA) provided by the host into a physical block address (PBA) through the flash translation layer (FTL). The flash translation layer (FTL) may receive the logical block address (LBA) by using a mapping table and convert the logical block address (LBA) into the physical block address (PBA). An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction component 1030 may perform error correction. The error correction component 1030 may perform error correction encoding (ECC encoding) based on data to be written to the memory device through memory interface 1060. The error correction encoded data may be transferred to the memory device through the memory interface 1060. The error correction component 1030 may perform error correction decoding (ECC decoding) on the data received from the memory device through the memory interface 1060. For example, the error correction component 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error correction component 1030, and the memory interface 1060. The control bus may be connected to the host interface 1040, the processor 1010, the buffer controller 1050, the memory buffer 1020, and the memory interface 1060.

Figure 16:
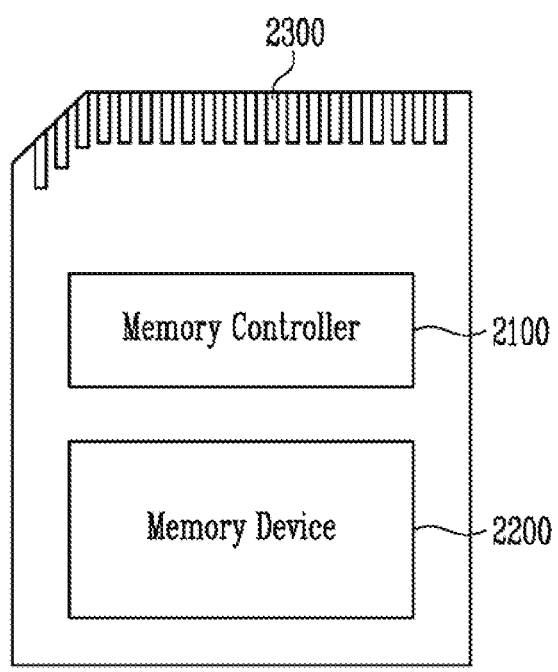
FIG. 16 is a block diagram illustrating a memory card system to which the storage device according to an embodiment of the present disclosure is applied.

FIG. 16 is a block diagram illustrating a memory card system to which the storage device according to an embodiment of the present disclosure is applied.

Referring to FIG. 16, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented equally to the memory device 100 described with reference to FIG. 2.

As an example, the memory controller 2100 may include components such as a random access memory (RAM), a processor, a host interface, a memory interface, and an error correction component.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), Fire-Wire, a universal flash storage (UFS), Wi-Fi, Bluetooth, and an NVMe. As an example, the connector 2300 may be defined by at least one of the various communication standards described above.

As an example, the memory device 2200 may be implemented as various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

In an embodiment, when the memory device 2200 performs the program operation, the channel initialization operation may be started in the pass voltage maintenance period included in the program phase. That is, because the channel initialization operation that was performed in the verify phase is performed in the program phase, a time point at which the channel initialization operation is started may become earlier.

Specifically, after the memory device 2200 applies a program pulse to the selected word line, the memory device 2200 may apply a pass voltage of a specific level to all word lines (pass voltage maintenance period). At this time, at the same time as the pass voltage maintenance period or when a preset period elapses after the pass voltage maintenance period is started, an operation for the channel initialization may be performed. The operation for the channel initialization may be an operation of applying a voltage of a specific level to all drain select lines and all source select lines to turn on the transistors connected to all drain select lines and all source select lines.

Thereafter, after applying the channel initialization voltage to all word lines and the voltage for initializing the channel to all drain select lines and all source select lines, the memory device 2200 may discharge the selected word line, the unselected drain select lines, and the unselected source select lines. When the selected word line, the unselected drain select lines, and the unselected source select lines are discharged, the channel initialization operation may be ended.

As a result, the channel initialization operation is started at the same time as the pass voltage maintenance period is started or during the pass voltage maintenance period, and thus the time consumed for the entire program operation may be shortened.

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 17:
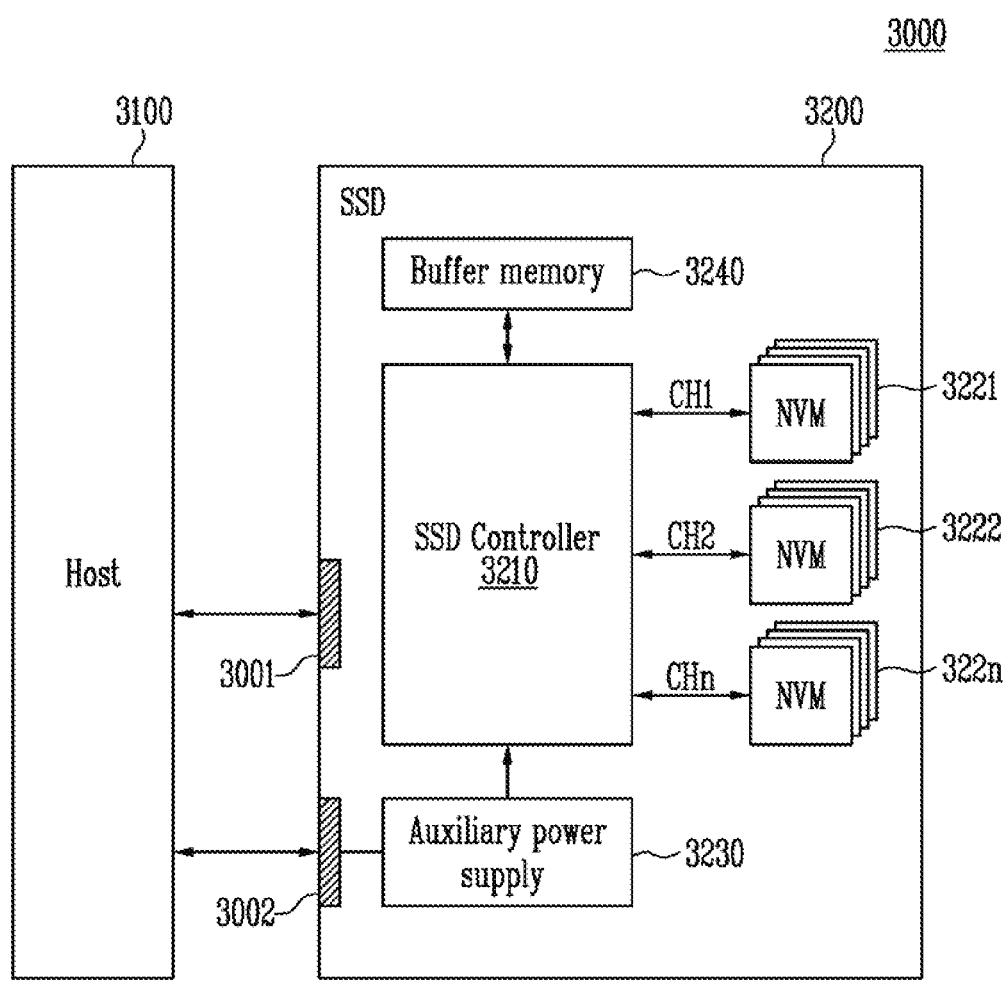
FIG. 17 is a block diagram illustrating a solid state drive (SSD) system to which the storage device according to an embodiment of the present disclosure is applied.

FIG. 17 is a block diagram illustrating a solid state drive (SSD) system to which the storage device according to an embodiment of the present disclosure is applied.

Referring to FIG. 17, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may perform the function of the memory controller 200 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (MCM), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

In an embodiment, when the plurality of flash memories 3221 to 322n perform the program operation, the channel initialization operation may be started in the pass voltage maintenance period included in the program phase. That is, because the channel initialization operation that was performed in the verify phase is performed in the program phase, a time point at which the channel initialization operation is started may become earlier.

Specifically, after the plurality of flash memories 3221 to 322n apply a program pulse to the selected word line, the plurality of flash memories 3221 to 322n may apply a pass voltage of a specific level to all word lines (pass voltage maintenance period). At this time, at the same time as the pass voltage maintenance period or when a preset period elapses after the pass voltage maintenance period is started, an operation for the channel initialization may be performed. The operation for the channel initialization may be an operation of applying a voltage of a specific level to all drain select lines and all source select lines to turn on the transistors connected to all drain select lines and all source select lines.

Thereafter, after applying the channel initialization voltage to all word lines and the voltage for initializing the channel to all drain select lines and all source select lines, the plurality of flash memories 3221 to 322n may discharge the selected word line, the unselected drain select lines, and the unselected source select lines. When the selected word line, the unselected drain select lines, and the unselected source select lines are discharged, the channel initialization operation may be ended.

As a result, the channel initialization operation is started at the same time as the pass voltage maintenance period is started or during the pass voltage maintenance period, and thus the time consumed for the entire program operation may be shortened.

The auxiliary power supply 3230 is connected to the host 3100 through the power connector 3002. The auxiliary power supply 3230 may receive the power PWR from the host 3100 and may charge the power. The auxiliary power supply 3230 may provide power of the SSD 3200 when power supply from the host 3100 is not smooth. As an example, the auxiliary power supply 3230 may be positioned in the SSD 3200 or may be positioned outside the SSD 3200. For example, the auxiliary power supply 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and a PRAM.

Figure 18:
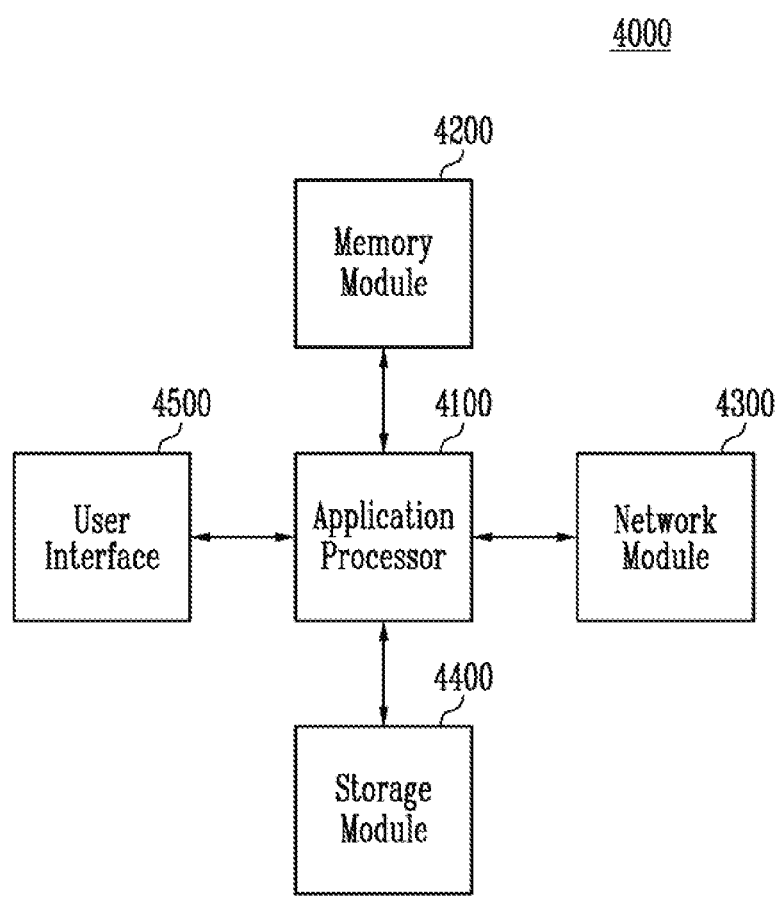
FIG. 18 is a block diagram illustrating a user system to which the storage device according to an embodiment of the present disclosure is applied.

FIG. 18 is a block diagram illustrating a user system to which the storage device according to an embodiment of the present disclosure is applied.

Referring to FIG. 18, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

In an embodiment, when the storage module 4400 performs the program operation, the channel initialization operation may be started in the pass voltage maintenance period included in the program phase. That is, because the channel initialization operation that was performed in the verify phase is performed in the program phase, a time point at which the channel initialization operation is started may become earlier.

Specifically, after the storage module 4400 applies a program pulse to the selected word line, the storage module 4400 may apply a pass voltage of a specific level to all word lines (pass voltage maintenance period). At this time, at the same time as the pass voltage maintenance period or when a preset period elapses after the pass voltage maintenance period is started, an operation for the channel initialization may be performed. The operation for the channel initialization may be an operation of applying a voltage of a specific level to all drain select lines and all source select lines to turn on the transistors connected to all drain select lines and all source select lines.

Thereafter, after applying the channel initialization voltage to all word lines and the voltage for initializing the channel to all drain select lines and all source select lines, the storage module 4400 may discharge the selected word line, the unselected drain select lines, and the unselected source select lines. When the selected word line, the unselected drain select lines, and the unselected source select lines are discharged, the channel initialization operation may be ended.

As a result, the channel initialization operation is started at the same time as the pass voltage maintenance period is started or during the pass voltage maintenance period, and thus the time consumed for the entire program operation may be shortened.

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDRAM, an LPDDR2 SDRAM, and an LPDDR3 SDRAM, or a non-volatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, and the plurality of non-volatile memory devices may operate identically to the memory device described with reference to FIGS. 2 and 3. The storage module may operate identically to the storage module 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A memory device comprising:
   drain select lines, source select lines, and a plurality of word lines arranged between the drain select lines and the source select lines; and
   a peripheral circuit configured to perform a program operation on selected memory cells connected to a selected word line among the plurality of word lines,
   wherein the peripheral circuit includes a voltage generator configured to generate a voltage for initializing a channel of a plurality of memory cells respectively connected to the plurality of word lines before a verify phase for determining whether the selected memory cells reach a target program state.

2. The memory device of claim 1, wherein the voltage generator is configured to apply, after the voltage generator applies a program voltage to the selected word line in a program phase, a pass voltage for setting the plurality of word lines to the same level to the plurality of word lines in a pass voltage maintenance phase included in the program phase.

3. The memory device of claim 2, wherein the voltage generator is configured to generate voltages for initializing channels of strings including the plurality of memory cells at the same time as the pass voltage maintenance phase is started.

4. The memory device of claim 3, wherein the voltage generator is configured to generate the voltages for initializing the channels including a first voltage for turning on transistors connected to the drain select lines and source select lines.

5. The memory device of claim 4, wherein, the voltage generator is configured to generate, after the transistors connected to the drain select lines and source select lines are turned on, the voltages for initializing the channels including a voltage to be applied to the plurality of word lines and a second voltage to be applied to the drain select lines and source select lines.

6. The memory device of claim 5, wherein the second voltage is higher than or equal to the first voltage.

7. The memory device of claim 5, wherein the voltage generator is configured to generate, when generation of the first voltage applied to the drain select lines and source select lines is stopped after the pass voltage maintenance phase is completed, a channel initialization voltage and the second voltage to be used in a verify phase among a plurality of phases included in the program operation.

8. The memory device of claim 5, wherein the voltage generator is configured to generate, when the pass voltage maintenance phase and generation of the first voltage applied to the drain select lines and source select lines are stopped or ended simultaneously, a channel initialization voltage and the second voltage when the verify phase is started.

9. The memory device of claim 5, wherein the voltage generator is configured to generate, when generation of the first voltage applied to the drain select lines and source select lines is stopped before the pass voltage maintenance phase is ended, a channel initialization voltage and the second voltage in the program phase.

10. The memory device of claim 2, wherein the voltage generator is configured to generate, when a preset time elapses after the pass voltage maintenance phase is started, the voltage for initializing the channel of the plurality of memory cells respectively connected to the plurality of word lines.

11. A memory device comprising:
    drain select lines, source select lines, and a plurality of word lines arranged between the drain select lines and the source select lines; and
    a peripheral circuit configured to perform a program operation on selected memory cells connected to a selected word line among the plurality of word lines,
    wherein the peripheral circuit includes a voltage generator configured to generate a channel initialization voltage to be applied to the plurality of word lines and a voltage to be applied to the drain select lines and source select lines, in order to initialize a channel of a plurality of memory cells respectively connected to the plurality of word lines before applying a verify voltage to the selected word line, when a verify phase is performed immediately after generating a program voltage to be applied to the selected word line in a program phase among a plurality of phases included in the program operation.

12. A method of operating a memory device comprising a plurality of word lines connected to a memory block, drain select lines, and source select lines connected to the memory block adjacent to the plurality of word lines, and a peripheral circuit configured to perform a program operation on selected memory cells connected to a selected word line among the plurality of word lines, the method comprising:
applying a program voltage to the selected word line;
applying a pass voltage to the plurality of word lines;
initializing a channel of a plurality of memory cells connected to the plurality of word lines when the pass voltage is applied to the plurality of word lines; and
verifying whether the selected memory cells reach a target program state after the initializing of the channel.

13. The method of claim 12, wherein the applying of the pass voltage comprises applying the pass voltage to the plurality of word lines to set the plurality of word lines to the same level after applying the program voltage to the selected word line.

14. The method of claim 13, wherein the initializing of the channel is started at the same time as the applying of the pass voltage is started.

15. The method of claim 13, wherein the initializing of the channel is started after a preset time elapses, and voltages for initializing channels of strings including the plurality of memory cells are generated in the initializing of the channel.

16. The method of claim 14, wherein a first voltage for turning on transistors connected to the drain select lines and source select lines is generated in the initializing of the channel.

17. The method of claim 16, wherein after the transistors connected to the drain select lines and source select lines are turned on, a channel initialization voltage to be applied to the plurality of word lines and a second voltage to be applied to the drain select lines and source select lines are generated in order to initialize the channel of the plurality of memory cells respectively connected to the plurality of word lines in the initializing of the channel.

18. The method of claim 17, wherein the second voltage is higher than or equal to the first voltage.

19. The method of claim 17, wherein, when generation of the first voltage applied to the drain select lines and source select lines is stopped after the applying of the pass voltage is ended, the channel initialization voltage and the second voltage are generated in the verifying of the selected memory cells.

20. The method of claim 17, wherein, when generation of the first voltage applied to the drain select lines and source select lines is stopped before the applying of the pass voltage is ended, the channel initialization voltage and the second voltage are generated in the applying of the program voltage.

* * * * *